(12) United States Patent
Solh (10) Patent No.: US 9,407,845 B1
(45) Date of Patent: Aug. 2, 2016

(54) SELF POWERING CAMERA

(71) Applicant: Amazon Technologies, Inc., Reno, NV (US)

(72) Inventor: Mashhour Solh, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 14/670,332

(22) Filed: Mar. 26, 2015

(51) Int. Cl.
*H04N 5/369* (2011.01)
*H01L 31/042* (2014.01)
*H04N 5/232* (2006.01)
*G03B 9/08* (2006.01)

(52) U.S. Cl.
CPC ............... *H04N 5/3698* (2013.01); *G03B 9/08* (2013.01); *H01L 31/042* (2013.01); *H04N 5/23241* (2013.01)

(58) Field of Classification Search
CPC ............... H04N 5/369–5/378; H04N 5/2254; G03B 9/08–9/54; G02B 3/0037–3/0068; H01L 31/04–31/078; H01L 27/14643–27/14676; H02J 7/00; H02J 9/00
See application file for complete search history.

(56) References Cited

U.S. PATENT DOCUMENTS

| | | | |
|---|---|---|---|
| 2005/0212957 A1* | 9/2005 | Wu | H02J 7/0052 348/372 |
| 2009/0225203 A1* | 9/2009 | Tanida | G02B 3/0056 348/262 |

* cited by examiner

*Primary Examiner* — Paul Berardesca
(74) *Attorney, Agent, or Firm* — Seyfarth Shaw LLP; Ilan N. Barzilay (57) ABSTRACT

Approaches provide for a computing device that includes, for example, a camera assembly, a lens assembly. The camera assembly can include an image sensor that includes, for example, a first region having camera pixels and a second region having photovoltaic cells. The camera pixels can be configured to capture light from the lens assembly for use in generating image data and the photovoltaic cells can be configured to capture light from the lens assembly for use in generating energy. The lens assembly can include a lens and a plurality of lens elements, where each lens element can be configured to direct a portion of light to a portion of the second region that includes the photovoltaic cells and the lens can be configured to direct a portion of the light to the first region that includes the camera pixels. A power collection component can be configured to process power from light received by the plurality of photovoltaic cells and an image analysis component can be configured to generate image data from light received by the camera pixels.

15 Claims, 7 Drawing Sheets

SELF POWERING CAMERA

BACKGROUND

As the capabilities of various computing devices increase, and as people are utilizing computing devices for an increasing variety of tasks, the expectations of users of these devices continues to increase accordingly. For example, mobile devices are increasingly offering multiple high quality cameras that enable additional types of functionality. These cameras can be used to acquire images and the image information for each image can be used by the device to determine a relative position and/or orientation of the user with respect to the device, object recognition, object tracking, or various other purposes. Often times, however, such functionality can be power intensive. In the situation of portable computing devices, or other such devices with limited battery power, such functionality can cause the battery to drain quickly, which can be undesirable for portable devices.

BRIEF DESCRIPTION OF THE DRAWINGS

Various embodiments in accordance with the present disclosure will be described with reference to the drawings, in which.

DETAILED DESCRIPTION

Systems and methods in accordance with various embodiments of the present disclosure may overcome one or more of the aforementioned and other deficiencies experienced in conventional approaches to capturing image data and generating power for an electronic device. In particular, various embodiments provide for a computing device (e.g., a camera, a mobile phone, a smart watch, smart glasses, a tablet, an electronic book, etc.) or other electronic device that includes, for example, a camera assembly, a lens assembly, a power collection component, an image analysis component among other components that can be used to capture image data and generate energy to power the device.

The camera assembly can include an image sensor that includes, for example, a first region having a plurality of camera pixels and a second region having plurality photovoltaic cells. The camera pixels can be configured to capture light from the lens assembly for use in generating image data and the photovoltaic cells can be configured to capture light from the lens assembly for use in generating energy. In accordance with various embodiments, the lens assembly can include a lens and a plurality of lens elements where each lens element can be configured to direct a portion of light to a portion of the second region that includes the photovoltaic cells and the lens can be configured to direct a portion of the light to the first region that includes the camera pixels. A power collection component can be configured to process power from light received by the plurality of photovoltaic cells and an image analysis component can be configured to generate image data from light received by the camera pixels. Accordingly, in accordance with various embodiments, the computing device can generate energy to power the device and/or concurrently perform image capturing and other such functions.

Various other applications, processes, and uses are presented below with respect to the various embodiments.

Figure 1A:
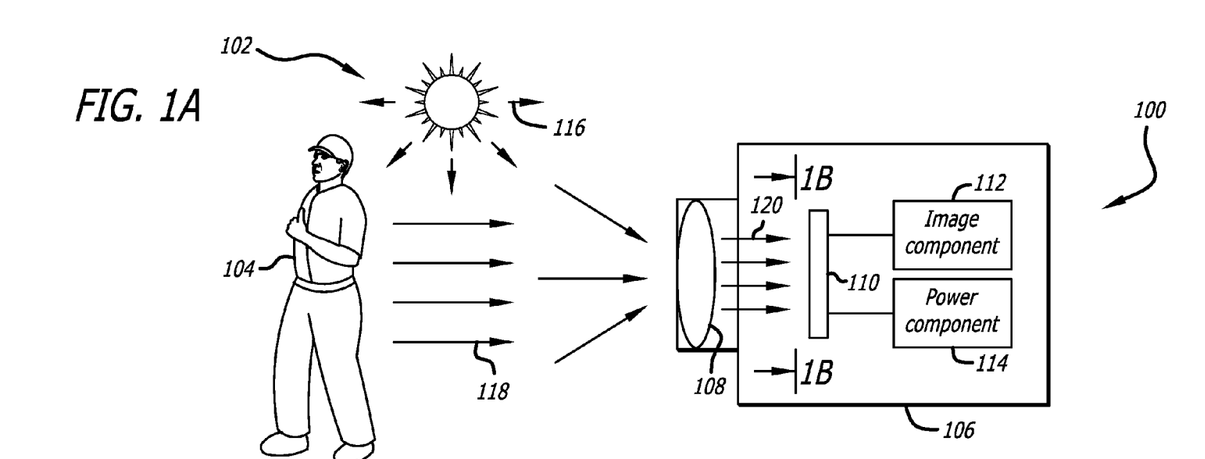
FIGS. 1A, 1B, and 1C illustrate an example of how a device might utilize a camera assembly that includes an image sensor and photovoltaic cells to capture image data and generate energy in accordance with various embodiments.

FIG. 1A illustrates an example 100 of how a device might utilize a camera assembly that includes an image sensor and photovoltaic cells to capture image data and generate energy in accordance with various embodiments. In this example, a computing device 106 is being used to capture an image of a user 104. Although a portable computing device (e.g., a smart phone or a camera) is shown, it should be understood that various other types of electronic devices can be used in accordance with various embodiments discussed herein. These devices can include, for example, notebook computers, personal data assistants, portable media players, wearable computers (e.g., smart watches, smart glasses, etc.), TVs, display monitors, camera or other surveillance devices, among others.

In this example, the device can include one or more cameras, where each camera can include, for example, a lens 108, and an image sensor 110, among other such components. The camera can couple with an image component 112, a power component 114 or other power storage component, and various other components. In accordance with various embodiments, the camera can be, for example, a front-facing camera, a rear-facing camera, a corner camera, a specialized camera (e.g., 360 degree camera), or another sensor operable to perform functions such as image and/or video capture. It should be noted, however, that there can be additional and/or alternative cameras placed in similar or alternative locations in accordance with various embodiments. It should be further noted that the device can include additional elements as well, such as illumination elements and focusing optics as discussed elsewhere herein. These cameras can be used to capture image data and the image data can be used by the device to generate an image, determine a relative position and/or orientation of a user with respect to the device, object recognition, object tracking, or various other purposes.

The lens 108 can be, for example, an optical lens or assembly of lenses used in conjunction with the device and other components to generate images of objects (e.g., person 104). In accordance with various embodiments, two fundamental parameters of an optical lens are the focal length and the maximum aperture. The lens's focal length determines the magnification of the image projected onto the image plane and the aperture the light intensity of that image. For a given photographic system the focal length determines the angle of view, short focal lengths giving a wider field of view than longer focal length lenses. A wider aperture, identified by a smaller f-number, allows using a faster shutter speed for the same exposure.

In accordance with various embodiments, the lens 108 can direct the path of light to recreate the image as accurately as possible on the image sensor. For example, as shown in FIG. 1A, light 116 from a light source (e.g., sun 102) and light reflecting off person 104 is received at lens 108. Lens 108 directs light 120 (i.e., the combination of light 118 and 116) onto image sensor 110. The light received at the image sensor can be utilized to generate image data that includes a representation of the person. Methods for capturing images using an image sensor with a computing device are well known in the art and will not be discussed herein in detail. It should be noted that the light source can be light provided from the sun or one or more artificial light sources, as may include a white light LED, or other such illumination element, useful in illuminating objects within at least a portion of a field of view of the camera.

The image sensor 110 can be, for example, a charge coupled device (CCD), a complementary metal oxide semiconductor (CMOS), or a sensor that can capture light and convert the value of light energy to some digital representation based on the frequency, color, and brightness. The image sensor can be a high or low-resolution image sensor. The image sensor can be used in still image capture or two-dimensional video capture, and can be, for example, an image sensor including a complimentary metal-oxide semiconductor (CMOS) device, a motion detection sensor, a charge coupled device (CCD), an infrared sensor, a quantum dot imager, a gallium arsenide sensor, or any other appropriate image capturing technology.

In accordance with various embodiments, the image sensor includes a plurality of pixels. The amount of detail that the camera can capture is called the resolution, and it is measured in pixels. In operation, light is captured by photosensitive diodes (i.e., pixels or photosites), each of which captures a single pixel in the image to be. The more pixels an image sensor has the more detail it can capture and the larger images can be without becoming blurry or "grainy." In accordance with various embodiments, typical resolutions include 256×256, 640×480, 1216×912, 1600×1200, 2240×1680, and 4064×2704. It should be noted that other resolutions are possible as well.

Figure 1B:
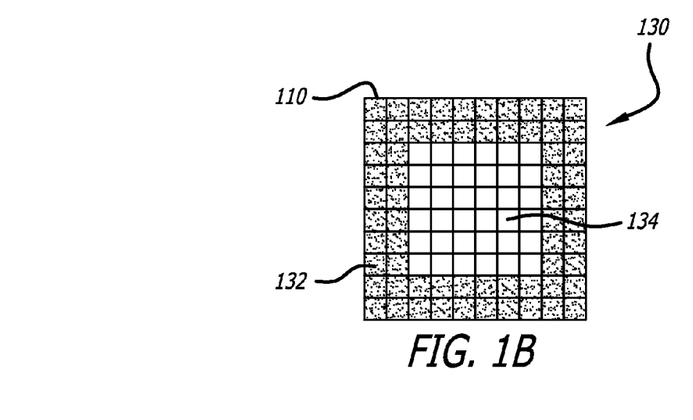

FIG. 1B illustrates an example 130 of an image sensor 110 that includes photovoltaic cells and pixels in accordance with various embodiments. As shown in FIG. 1B, the image sensor includes a first region that includes pixels 134 and a second region that includes photovoltaic cells 132. As described, the image sensor can be one of charge-coupled device (CCD), complementary metal-oxide-semiconductor (CMOS), or other photosensitive electronic that can include a large number of single sensor elements (i.e., pixels), each of which can record a measured intensity level. It should be noted that the illustrated size of a pixel relative to the photovoltaic cells is not necessarily shown according to scale, and the sizes shown are merely for illustration purposes.

In accordance with various embodiments, the sensor array can be covered with a patterned color filter mosaic having red, green, and blue regions in the Bayer filter arrangement, so that each sensor element can record the intensity of a single primary color of light. The computing device can interpolate the color information of neighboring sensor elements, through a process called demosaicing, to create the final image.

In accordance with an embodiment, a photovoltaic cell can be an electrical device that converts the energy of light directly into electricity by the photovoltaic effect. It is a form of photoelectric cell, defined as a device whose electrical characteristics, such as current, voltage, or resistance, vary when exposed to light. In this way, photovoltaic cells are employed to absorb photons from a light source, create a current, and thus produce electricity that can be stored or used to power an electronic device. Other sensors that generate energy that can be used in accordance with various embodiments include, for example, thermoelectric materials that convert temperature differences to electric voltage, antennas that convert propagating electromagnet waves to electrical signals, magnetic cartridge that converts physical motion to electrical signals, as well as other transducers that convert energy from one form to another.

In this example, the photovoltaic cells 132 are arranged around a circumference of the image sensor 110. In accordance with an embodiment, photons from light 120 are absorbed and used to create a current, and thus electricity, which can be used to power computing device 106. In various embodiments, the electricity can be stored in power component 114. In accordance with various embodiments, example power storage components include, for example, a battery operable to be recharged through conventional plug-in approaches, or through other approaches such as capacitive charging through proximity with a power mat or other such component, or through energy generated via the photovoltaic-cells. In accordance with various embodiments, the power storage component can correspond to at least one of, for example, a lead-acid battery, a nickel cadmium battery (NiCd), a nickel metal hydride (NiMH) battery, a lithium ion (Li-ion) battery, a lithium ion polymer (Li-ion polymer) battery, or another component configured to store energy.

A drawback to such an arrangement, however, is that as the area of region two that includes the photovoltaic cells increases and the area of region one that includes the camera sensor decreases, the resolution of the image decreases. In accordance with an embodiment, resolution can refer to the number of pixels in an image and can be identified by the width and height of the image as well as the total number of pixels in the image. For example, an image that is 2048 pixels wide and 1536 pixels high (2048×1536) contains (multiply) 3,145,728 pixels (or 3.1 Megapixels). As the megapixels in the device increases, so does the possible maximum size image the device can generate. This means that a 5 megapixel camera is capable of capturing a larger image than a 3 megapixel camera. In this way, because the number of pixels decreases (e.g., because the number of photovoltaic cells is increased), the resolution of the image correspondingly decreases.

Figure 1C:
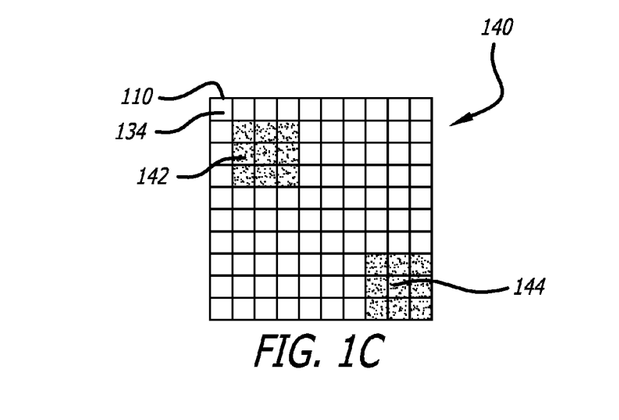

FIG. 1C illustrates an example 140 of a camera assembly that includes an image sensor 110 that includes photovoltaic cells 142 and 144 intermixed with a plurality of pixels 134 in accordance with various embodiments. In accordance with various embodiments, the photovoltaic cells can be grouped in any number of ways. This can include, for example, a first photovoltaic cell of the plurality of photovoltaic cells being intermixed in a first position with the plurality of pixels and a second photovoltaic cell of the plurality of photovoltaic cells being intermixed in a second position with the plurality of pixels. Intermixing photovoltaic cells and pixels can include having an arrangement that includes a mix of photovoltaic cells and pixels. For example, the photovoltaic cells can be grouped in a 3×3 arrangement within a larger grouping of pixels, where the width of the grouping is three pixels and the height of the grouping is three pixels. It should be noted that other groupings are possible as well. In an embodiment, the pattern of spacing of the grouping (or single) photovoltaic cells can be regular. For example, a 2×2 grouping of photovoltaic cells can be centered or otherwise placed within every 10×10 grouping of pixels. It should be noted that other pattern spacing of the photovoltaic cells are possible as well. In an embodiment, the pattern of spacing of the grouping (or single) photovoltaic cell can be irregular. As described above, the 2×2 grouping of photovoltaic cells can be centered or otherwise placed within every 10×10 grouping of pixels. The 2×2 grouping can be centered or otherwise randomly or irregular placed within the plurality of pixels. This can include, for example, placing the 2×2 grouping every 5×5, then 8×8, or some other positioning within the plurality of pixels. In should be noted that the photovoltaic cells can be grouped in a regular pattern, an irregular pattern, or a combination of the two patterns.

In accordance with various embodiments, in some situations, the placement of the photovoltaic cells may reduce image quality and/or resolution. This can be due to the fact that photovoltaic cells are being placed where camera pixels would normally be placed. As such, there is less image data being captured and/or incomplete image data being captured because there are fewer pixels to capture image data. In this situation, one or more image processing algorithms can be used to estimate the pixel data for the "missing" pixels or for the position of the grouping of photovoltaic cells. In this way, image interpolation algorithms can be used to estimate the image data for the missing pixels due to the placement of the photovoltaic cells. Example image interpolation algorithms include nearest neighbor interpolation, bilinear interpolation, bicubic interpolation, spline interpolation, sinc interpolation, among other techniques to estimate image data for the missing pixels.

In certain embodiments, rather than replace pixels with photovoltaic cells, the pixels can include a photovoltaic coating. In this situation, the image sensor can perform the tasks of sensing and energy harvesting. The image sensor can be based on hybrid pixels whose photodiodes can be configured to work as photosensors or photoelectric cells. The hybrid pixels allow the image sensor to capture energy in between frames or while the camera is not being used to capture image data. It should be noted that the embodiments described herein are not limited to the illustrated arrangement of pixels and photovoltaic cells. Rather, in accordance with various embodiments, a combination of hybrid pixels, pixels, and photovoltaic cells can be used. Alternatively, in various embodiments the arrangement can comprise entirely of hybrid pixels.

FIGS. 2A, 2B, 2C, and 2D illustrate an example of how a device might utilize a shutter that includes photovoltaic cells to generate energy in accordance with various embodiments. As shown in example 200 of FIG. 2A, a computing device 206 is being used to capture an image of a user 204. In this example, the computing device 206 includes a lens 208, a shutter 210, an image sensor 211, an image component 212, and a power component 214.

Figure 2A:
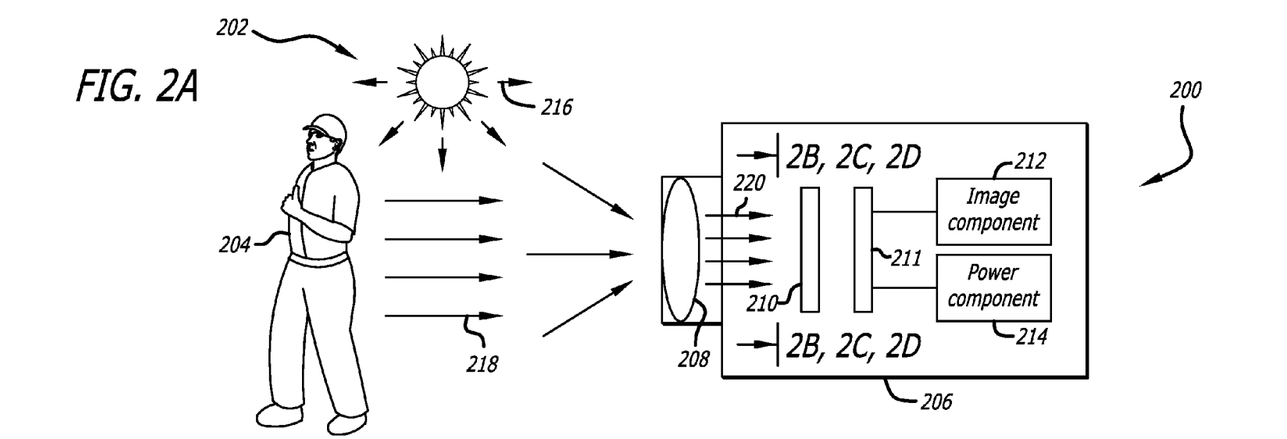
FIGS. 2A, 2B, 2C, and 2D illustrate an example of how a device might utilize a shutter that includes photovoltaic cells to generate energy in accordance with various embodiments.

As described, the lens 208 can be, for example, an optical lens or assembly of lenses used in conjunction with the device and other components to generate images of objects (e.g., person 204). It should be noted that illustrated size of the lens relative to the plurality of lens elements is not necessarily shown according to scale, and the sizes shown are merely for illustration purposes. It should be further noted that the illustrated size of the computing device elements is not necessarily shown according to scale, and the sizes shown are merely for illustration purposes.

The lens can direct the path of light to recreate the image as accurately as possible on the image sensor. For example, as shown in FIG. 2A, light 216 from a light source (e.g., sun 202) and light 218 reflecting off person 204 is received at lens 208. Lens 208 directs light 220 (i.e., the combination of light 218 and 216) onto sensor 211. The light received at the image sensor can be utilized to generate image data that includes a representation of the person.

In accordance with an embodiment, the shutter allows light to pass for a determined period of time, exposing the image sensor to light in order to capture an image of a scene or object (e.g., object 204). In various embodiments, the shutter can include photovoltaic cells on the shutter. In this way, when the shutter is a closed position, photons from light 220 can be absorbed by the photoelectric cells, a current can be created, and thus electricity generated. The generated electricity can be stored in power component 214 or used to power the computing device. When the shutter is in an open position, light 220 can be received at the camera sensor. As described, the camera sensor includes pixels that are configured to capture the light and the captured light can be used by the image component 212 to generate an image.

Figure 2B:
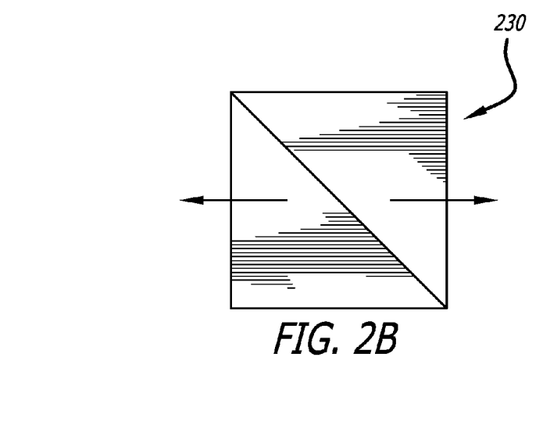
Figure 2C:
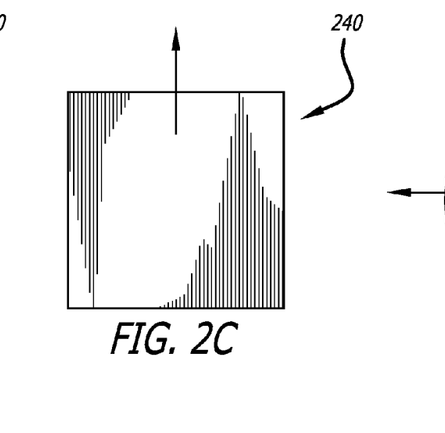
Figure 2D:
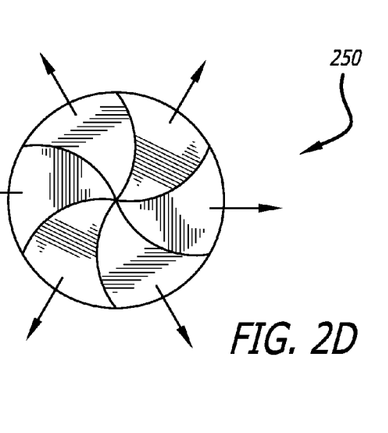

In accordance with various embodiments, the shutter can be one of a number of shutter types. Example 230 of FIG. 2B illustrates a first type of shutter in accordance with various embodiments. In this example, a two-curtain shutter is shown. In accordance with various embodiments, two shutter curtains run horizontally or vertically across the focal plane. Example 240 of FIG. 2C illustrates a second type of shutter in accordance with various embodiments. In this example, a focal plane shutter is shown. In accordance with various embodiments, focal-plane shutter is positioned just in front of the image sensor, in the focal plane, and moves an aperture across the image sensor until the full frame has been exposed. The focal plan shutter may operate either horizontally or vertically. Example 250 of FIG. 2D illustrates a third type of shutter in accordance with various embodiments. In this example, a leaf shutter is shown. In accordance with various embodiments, a leaf shutter is a type of camera shutter consisting of a mechanism with one or more pivoting metal leaves which normally does not allow light through the lens onto the film or digital image sensor, but which when triggered opens the shutter by moving the leaves to uncover the lens for the required time to make an exposure, then shuts. It should be noted that other shutters are possible and the described shutters are merely examples of possible shutter types.

Figure 3A:
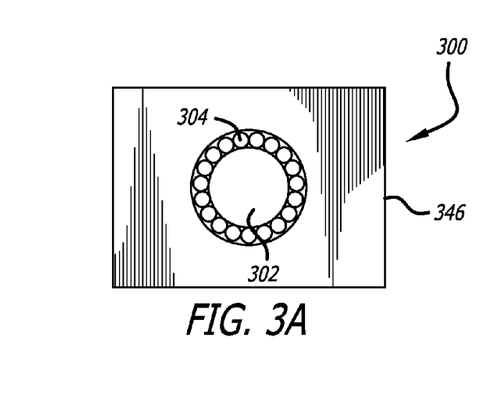
FIGS. 3A, 3B, and 3C illustrate an example of a device that might utilize a lens assembly and a camera assembly to capture image data and generate energy in accordance with various embodiments.
Figure 3B:
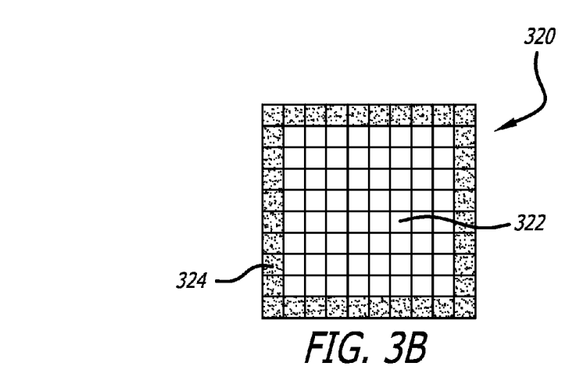
Figure 3C:
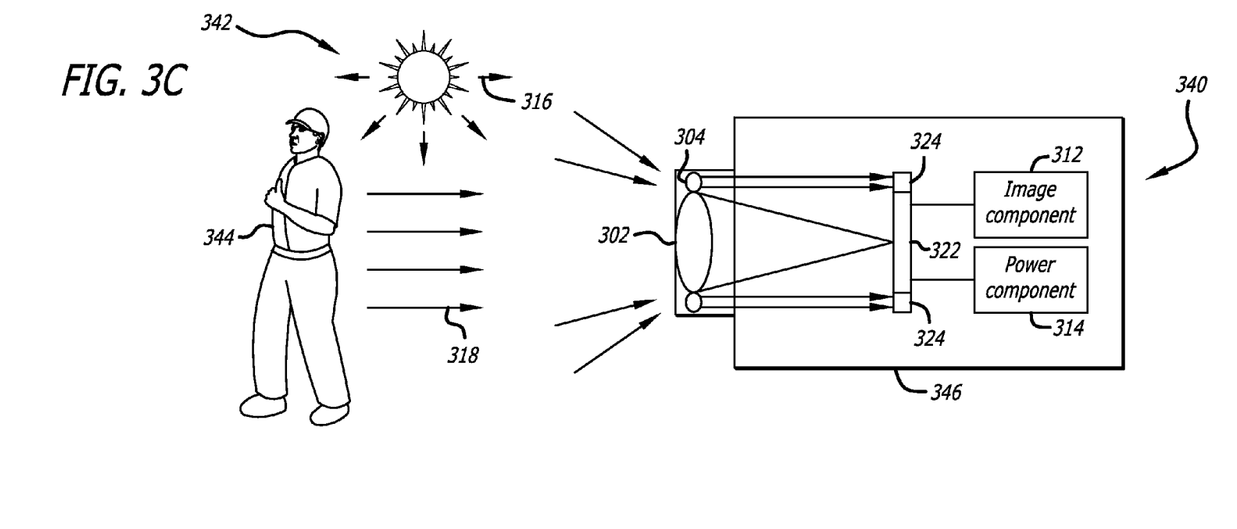

FIGS. 3A, 3B, and 3C illustrate an example of a device that might utilize a lens assembly and a camera assembly to capture image data and generate energy in accordance with various embodiments. Example 300 of FIG. 3A illustrates an example lens assembly in a computing device 346. The lens assembly can include a lens 302 and a plurality of lens elements 304. It should be noted that illustrated size of the lens relative to the plurality of lens elements is not necessarily shown according to scale, and the sizes shown are merely for illustration purposes. In one example, each lens element is a lens that can be arranged around a circumference of the lens. In another example, the lens is positioned in a first layer of the lens assembly and the plurality of lens elements are positioned in a second layer of the lens assembly. In this example, the first layer includes a first surface of the lens that receives incident light from a light source and the second layer includes a second surface of the lens. The second surface can be facing the camera sensor, where the plurality of lens elements can be coupled along a circumference of the second surface of the lens. This can include, for example, incorporating the lens elements along a perimeter of a circumference of the lens. In certain embodiments, where the lens includes a number of different lens, the lens elements can be incorporated along the perimeter of any one of the lenses. In this way, light incident along the perimeter of the lens (or any one of the lenses) is directed in a first direction due to the lens element and light incident the lens is directed in a second direction. The second direction can include, for example, a direction that intersects the photovoltaic cells and the first direction can include, for example, a direction that intersects the image sensor.

In accordance with various embodiments, the lens and lens elements can be a transparent piece of glass or plastic with at least one curved surface. In accordance with various embodiments, the lens works by refraction in that it bends light rays as they pass through it so they change direction and coverage at a point, such as a focal point. There are two main types of lenses, known as convex (or converging) and concave (or diverging). In a convex lens, the glass (or plastic) surfaces bulge outwards in the center giving the classic lentil-like shape. A convex lens is also called a converging lens because it makes parallel light rays passing through it bend inward and meet (converge) at a spot just beyond the lens known as the focal point. A concave lens is exactly the opposite with the outer surfaces curving inward, so it makes parallel light rays curve outward or diverge. In accordance with various embodiments, a lens can be a combination of convex and concave lenses. A lens that uses two or more simpler lenses in this way is called a compound lens.

In accordance with various embodiments, the lens can include two surfaces, where the two surfaces are parts of the surfaces of spheres. Each surface can be convex (bulging outwards from the lens), concave (depressed into the lens), or planar (flat). The line joining the centers of the spheres making up the lens surfaces is called the axis of the lens. Typically the lens axis passes through the physical center of the lens, because of the way they are manufactured. Lenses may be cut or ground after manufacturing to give them a different shape or size. The lens axis may then not pass through the physical center of the lens.

A lens can be defined by the curvature of the two optical surfaces. A lens is biconvex (or double convex, or just convex) if both surfaces are convex. If both surfaces have the same radius of curvature, the lens is equiconvex. A lens with two concave surfaces is biconcave (or just concave). If one of the surfaces is flat, the lens is plano-convex or plano-concave depending on the curvature of the other surface. A lens with one convex and one concave side is convex-concave or meniscus.

If the lens is biconvex or plano-convex, a collimated beam of light passing through the lens will be converged (or focused) to a spot behind the lens. In this case, the lens is called a positive or converging lens. The distance from the lens to the spot is the focal length of the lens, which is commonly abbreviated f.

If the lens is biconcave or plano-concave, a collimated beam of light passing through the lens is diverged (spread); the lens is thus called a negative or diverging lens. The beam after passing through the lens appears to be emanating from a particular point on the axis in front of the lens; the distance from this point to the lens is also known as the focal length, although it is negative with respect to the focal length of a converging lens.

FIG. 3B illustrates an example 320 of a camera assembly that includes an image sensor that includes photovoltaic cells and pixels in accordance with various embodiments. In this example, the image sensor includes a first region that includes pixels 322 and a second region that includes photovoltaic cells 324. It should be noted that illustrated size of a pixel relative to the photovoltaic cells is not necessarily shown according to scale, and the sizes shown are merely for illustration purposes. As described, the image sensor can be one of charge-coupled device (CCD), complementary metal-oxide-semiconductor (CMOS), or other photosensitive electronic that can include a large number of single sensor elements (i.e., pixels), each of which can record a measured intensity level. In accordance with various embodiments, the pixels can be configured to capture light from the lens assembly for use in generating image data and the photovoltaic cells can be configured to capture light from the lens assembly for use in generating energy.

As shown in example 340 of FIG. 3C, the computing device 346 is being used to capture an image of a user 344. In this example, the computing device 346 includes the lens assembly that includes lens 302 and lens elements 304, a camera assembly that includes an image sensor, wherein the image sensor includes a first region that includes a plurality of camera pixels 322 and a second region that includes a plurality of photovoltaic cells 324, an image component 312, and a power component 314.

As described, the lens assembly can include, for example, a lens and a plurality of lens elements that can be used in conjunction with the device and other components to make images of objects (e.g., person 344) and generate energy to power the device and/or storage. For example, as shown in FIG. 3C, light 316 from a light source (e.g., sun 342) and light 318 reflecting off person 344 is received at lens 302 and lens elements 304. Each lens element can be configured to direct a portion of light to a portion of the second region that includes the photovoltaic cells and the lens can be configured to direct a portion of the light to the first region that includes the camera pixels. A power collection component 314 can be configured to process power from light received by the plurality of photovoltaic cells and an image component 312 can be configured to generate image data from light received by the camera pixels. Accordingly, in accordance with various embodiments, the computing device can generate energy to power the device and concurrently perform image capturing and other such functions.

As described, each lens element can be configured to direct a portion of light to a portion of the second region that includes the photovoltaic cells and the lens can be configured to direct a portion of the light to the first region that includes the camera pixels. For example, a positive or converging lens in air will focus a collimated beam travelling along the lens axis to a spot (known as the focal point) at a distance f from the lens. Conversely, a point source of light placed at the focal point will be converted into a collimated beam by the lens. These two cases are examples of image formation in lenses. In the former case, an object at an infinite distance (as represented by a collimated beam of waves) is focused to an image at the focal point of the lens. In the latter, an object at the focal length distance from the lens is imaged at infinity. The plane perpendicular to the lens axis situated at a distance f from the lens is called the focal plane.

In accordance with various embodiments, each of the lens elements can be selected such that light passing through a lens element directs light to a portion of the photoelectric cells. In this way, the a lens element of the plurality of lens elements can be configured such that light passing through the lens element is directed or otherwise mapped to a portion of the photoelectric cells.

In accordance with various embodiments, such a lens assembly can be part of the computing device or part of an accessory device such as a lens that can couple to the computing device. Example computing devices include a macro lens, a zoom lens, special purpose lens, or other accessory devices. It should be noted that in accordance with various embodiments, a combination of hybrid pixels, pixels, and photovoltaic cells can be used. The hybrid pixels, pixels, and photovoltaic cells can be used in any arrangement. Further, in various embodiments, the arrangement can comprise entirely of hybrid pixels. Further still, in accordance with various embodiments, any of the approaches described with respect to FIGS. 1 and 2 can be incorporated with approaches described with respect to FIG. 3.

Figure 4:
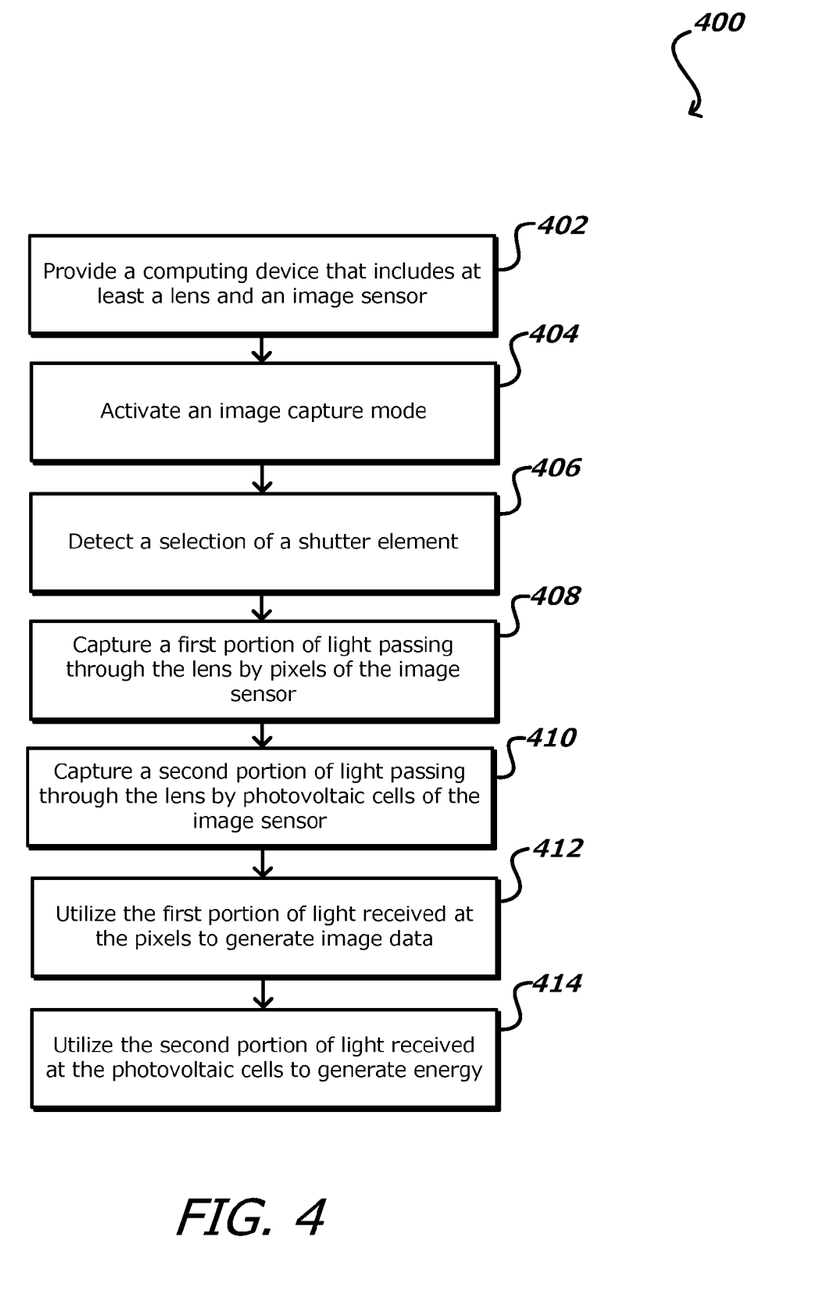
FIG. 4 illustrates an example process for capturing image data and generating energy in accordance with various embodiments.

FIG. 4 illustrates an example process for capturing image data and generating energy in accordance with various embodiments. It should be understood that, for any process discussed herein, there can be additional, fewer, or alternative steps performed in similar or alternative orders, or in parallel, within the scope of the various embodiments unless otherwise stated. In this example, a computing device that includes a camera that includes, for example, a lens, and an image sensor, among other such components, is provided 402. The camera can couple with an image component, a power component, and various other components. The lens can be, for example, an optical lens or assembly of lenses used in conjunction with the device and other components to generate images of objects (e.g., person) or scenes. The camera sensor can include a plurality of camera pixels and a plurality of photovoltaic cells. As described, the photovoltaic cells can be arranged on the image sensor in a number of different ways. For example, the photovoltaic cells can be arranged around a circumference of the image sensor. In another example, the photovoltaic cells are intermixed with a plurality of pixels. For example, the photovoltaic cells can be grouped in a 3×3 arrangement, where the width of the grouping is three pixels and the height of the grouping is three pixels. In an embodiment, the pattern of spacing of the grouping (or single) photovoltaic cells can be regular. For example, a 2×2 grouping of photovoltaic cells can be centered or otherwise placed within every 10×10 grouping of pixels. In an embodiment, the pattern of spacing of the grouping (or single) photovoltaic cell can be irregular. As described above, the 2×2 grouping of photovoltaic cells can be centered or otherwise placed within every 10×10 grouping of pixels. The 2×2 grouping can be centered or otherwise randomly or irregular placed within the plurality of pixels. The random arrangement scheme can include, for example, placing the 2×2 grouping every 5×5, then 8×8, or some other positioning within the plurality of pixels.

An image capture mode or other such mode of the computing device can be activated 404. In this mode, the computing device can be used to capture light, which can be used to generate image data (e.g., image or video data) or utilized in other ways. A selection of a shutter element (e.g., a physical shutter or a graphical representation of a shutter) can be detected 406. For example, a user of the device (e.g., a mobile phone that includes a camera) can press a physical shutter button or select a graphical representation of a shutter). In response to the selection of the shutter element, a first portion of the light passing through the lens can be captured 408 by at least a portion of the plurality of pixels and a second portion of light passing through the lens can be captured 410 by at least a portion of the photovoltaic cells. The first portion of light received at the plurality of pixels can be utilized 412 to generate image data that includes a representation of the object and the second portion of light received at the plurality of photovoltaic cells can be utilized 414 to create a current, and thus electricity, which can be used to power computing device. Accordingly, in accordance with various embodiments, the computing device can generate energy to power the device and/or concurrently perform image capturing and other such functions.

Figure 5:
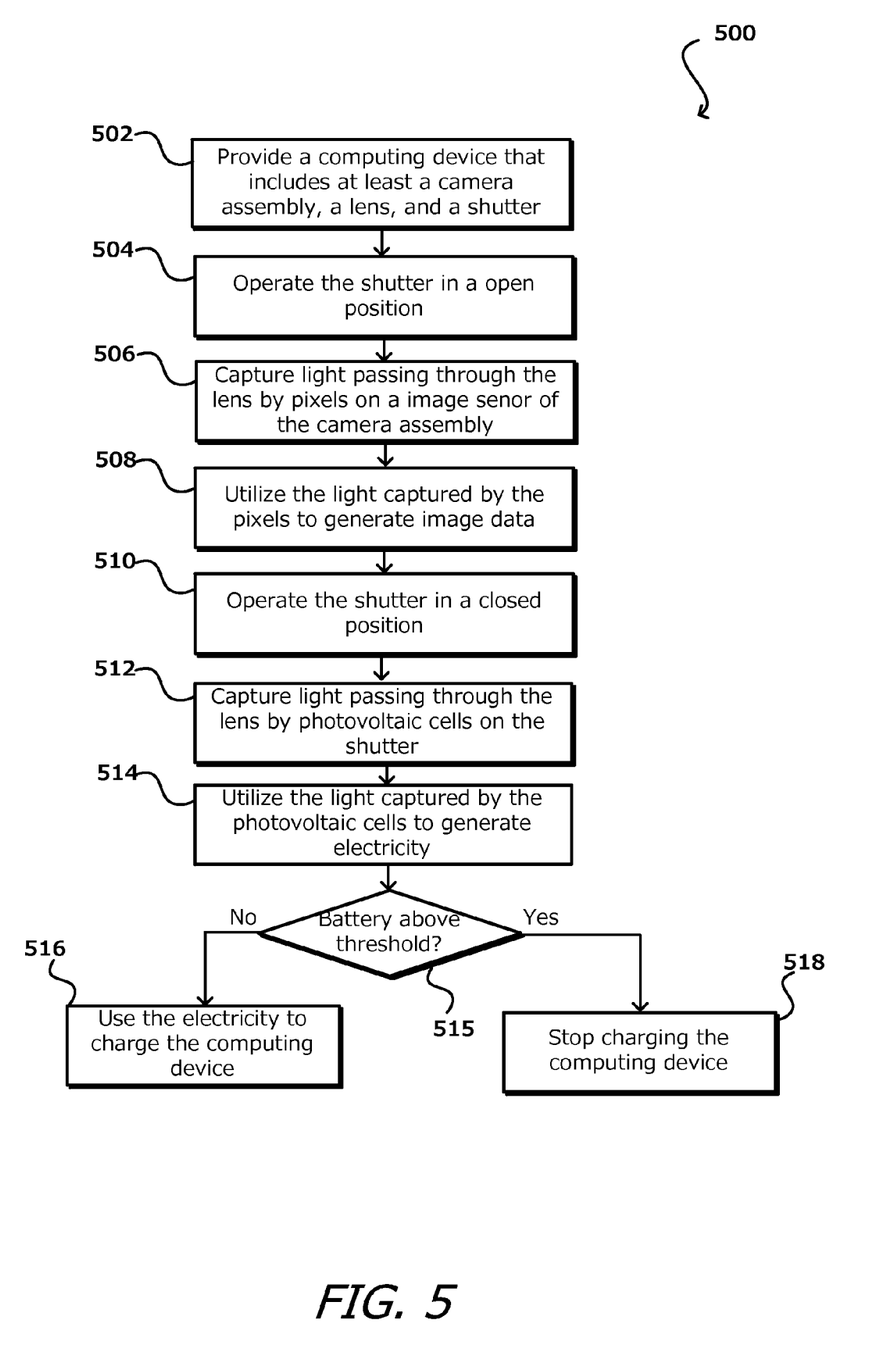
FIG. 5 illustrates an example process for capturing image data and generating energy in accordance with various embodiments.

FIG. 5 illustrates an example process for capturing image data and generating energy in accordance with various embodiments. In this example, a computing device that includes at least a camera assembly, a lens, and a shutter is provided 502. The camera assembly can include a camera sensor that includes a plurality of pixels. In various embodiments, the camera sensor can also include a plurality of photovoltaic cells. The lens assembly can include a lens to direct light to the camera sensor. In various embodiments, the lens assembly can further include a plurality of lens elements arranged around a circumference of the lens. The shutter can include photovoltaic cells thereon. In accordance with various embodiments, the shutter is configured to operate in a first position, open, and a second position closed.

In the situation where the shutter is operated 504 in the open position, light passing through the lens can be captured 506 by at least a portion of the plurality of pixels. The light received at the plurality of pixels can be utilized 508 to generate image data that includes a representation of an object or scene. In the situation where the shutter is operated 510 in the closed position, light passing through the lens can be captured 512 by at least a portion of the photovoltaic cells on the shutter. The light received at the plurality of photovoltaic cells can be utilized 514 to create a current, and thus electricity, which can be used to power the computing device and/or be stored. For example, in the situation where it is determined 515 that the battery level of the device is below a determined amount, the electricity is used 516 to charge the computing device. The determination can include, for example, monitoring the power level of a battery of the device, where the power level can include the amount of energy stored on the battery. The threshold can include, for example, a percentage of the maximum potential energy stored on the battery. In this way, the current power level of the battery can be compared to a percentage of the maximum potential energy of the battery (e.g., 20 percent). If it is determined that the current power level is below the percentage threshold, the electricity can be used to charge and/or power the computing device. In another example, the determination can include determining and monitoring the amount of time before the energy of the battery is completely used. Determining the amount of time before the energy of the battery is completely used can be based on the current energy use by the device and the batteries current stored energy. The threshold can include, for example, an amount of time until the battery is completely used or can no longer be used to power the device. In this way, the amount of time until the batter is completely used can be compared to a time threshold. If it is determined that the amount of time is below the time threshold, the electricity can be used to charge and/or power the computing device.

In the situation where it is determined that the battery level of the device is above a determined amount, the device stops 518 charging the battery. This can include, for example, operating a switch in an open state to disconnect the battery from an energy conversation component or other such component that can covert light energy into electricity. In this example, when the switch (e.g., an electrical switch or a mechanical) is in an open position, current does not flow from the energy conversation component to the battery. When the switch is in a closed position, current flows from the energy conversation component to the battery. Example switches can include solid state devices such as transistors. Accordingly, in accordance with various embodiments, the computing device can generate energy to power the device or perform image capturing and other such functions. In should be noted that in various embodiments, approaches using a shutter that includes photovoltaic cells to generate energy and approaches using an image sensor that includes the photovoltaic cells to generate image data and energy can be combined.

Figure 6:
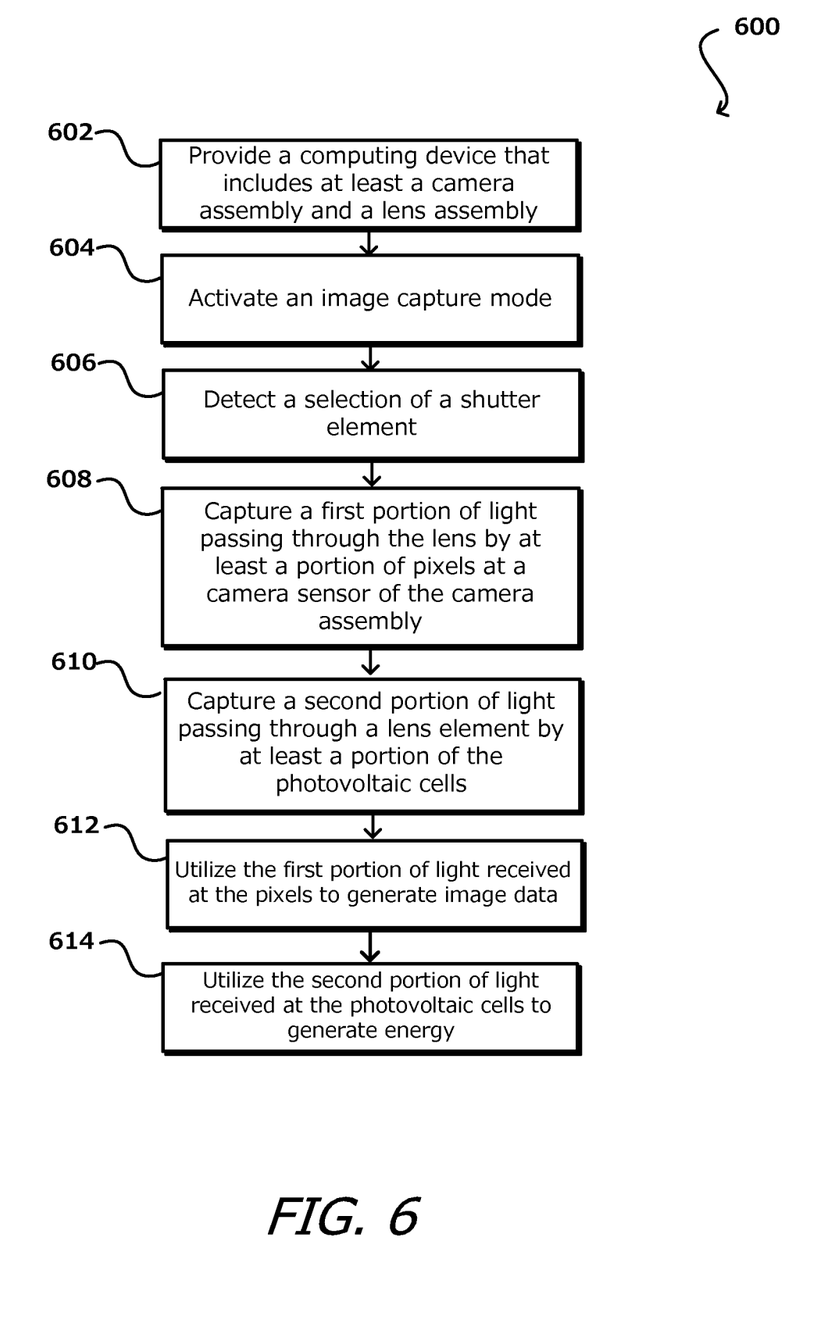
FIG. 6 illustrates an alternate example process for capturing image data and generating energy in accordance with various embodiments.

FIG. 6 illustrates an example process for generating energy in accordance with various embodiments. In this example, a computing device that includes at least a camera assembly, a lens assembly, a power collection component and an image analysis component is provided 602. The lens assembly can include a lens and a plurality of lens elements. In one example, each lens element is a lens that can be arranged around a circumference of the lens. In another example, the lens is positioned in a first layer of the lens assembly and the plurality of lens elements are positioned in a second layer of the lens assembly. The camera assembly includes an image sensor that includes photovoltaic cells and pixels. In this example, the image sensor includes a first region that includes the pixels and a second region that includes photovoltaic cells. In accordance with various embodiments, the pixels can be configured to capture light from the lens assembly for use in generating image data and the photovoltaic cells can be configured to capture light from the lens assembly for use in generating energy.

An image capture mode or other such mode of the computing device can be activated 604. In this mode, the computing device can be used to capture light, which can be used to generate image data (e.g., image or video data) that includes a representation of an object or scene or utilized in other ways. A selection of a shutter element (e.g., a physical shutter or a graphical representation of a shutter) can be detected 606. For example, a user of the device (e.g., a mobile phone that includes a camera) can press a physical shutter button or select a graphical representation of a shutter). In response to the selection of the shutter element, light from a light source is received at the lens and the plurality of lens elements. A first portion of the light passing through the lens can be captured 608 by at least a portion of the plurality of pixels and a second portion of light passing through a lens element can be captured 610 by at least a portion of the photovoltaic cells. The first portion of light received at the plurality of pixels can be utilized 612 to generate image data that includes a representation of the object and the second portion of light received at the plurality of photovoltaic cells can be utilized 614 to create a current, and thus electricity, which can be used to power computing device. Accordingly, in accordance with various embodiments, the computing device can generate energy to power the device and/or concurrently perform image capturing and other such functions. In should be noted that in various embodiments, approaches using a shutter that includes photovoltaic cells to generate energy and approaches using an image sensor that includes the photovoltaic cells to generate image data and energy can be combined with approaches in using a lens assembly that includes a plurality of lens elements.

Figure 7:
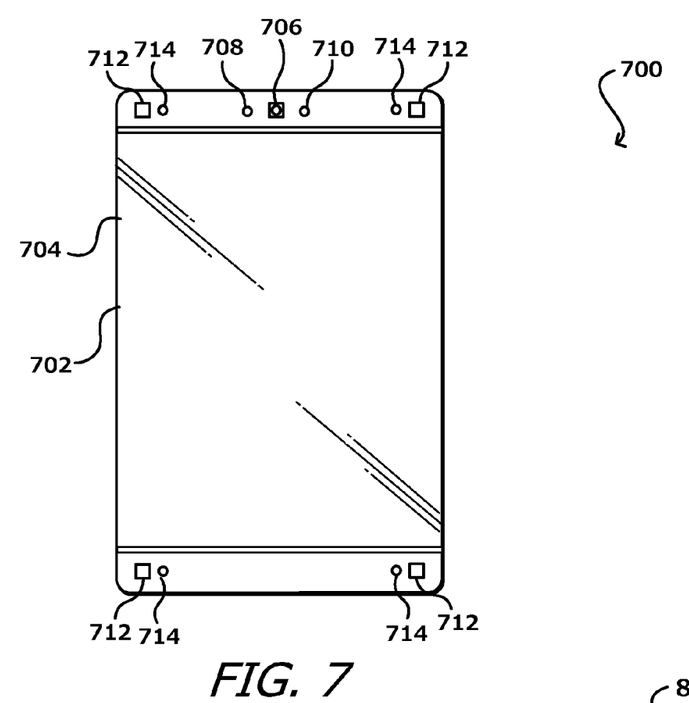
FIG. 7 illustrates an example device that can be used to implement aspects of the various embodiments.

FIG. 7 illustrates a front view 700 of an example computing device 702 that can be used to perform methods in accordance with various embodiments discussed and suggested herein. In this example, the device has a front-facing camera 706 (i.e., a camera on the same side of the device as a display screen 704) that can be used for purposes such as video conferencing. Along with the camera, the device can also have elements such as a light sensor 708 for determining an amount of ambient light around the device, and a white light LED 710 or other such light source capable of operating as a flash, or otherwise providing light for the front-facing camera 706. The computing device also includes four camera sensors 712, which in this example can have a lower resolution, power requirement, and/or color depth than the front-facing camera 706. Such sensors can be used for purposes such as head tracking and gesture input, for example, which can require image data to be captured over a period of time but do not require full or higher resolution images. Along with each (or at least some) of these camera sensors 712 can also be a light source, such as an IR LED 714, that can emit IR that, when reflected, can be directed back toward at least the associated camera sensor 712. Placing the LEDs near the sensors can have the advantage that objects, such as human eyes, that function as retro-reflectors can enable those objects to be detected by the adjacent sensors in the captured image data. In at least some embodiments, the distance between a camera sensor and an LED can be at least 1-2 mm. It should be understood that reference numbers for similar elements can be used within a figure, or carried over between figures, for purposes of explanation and ease of understanding, but that such use should not be read as a limitation on the scope of the various embodiments unless otherwise stated.

Figure 8:
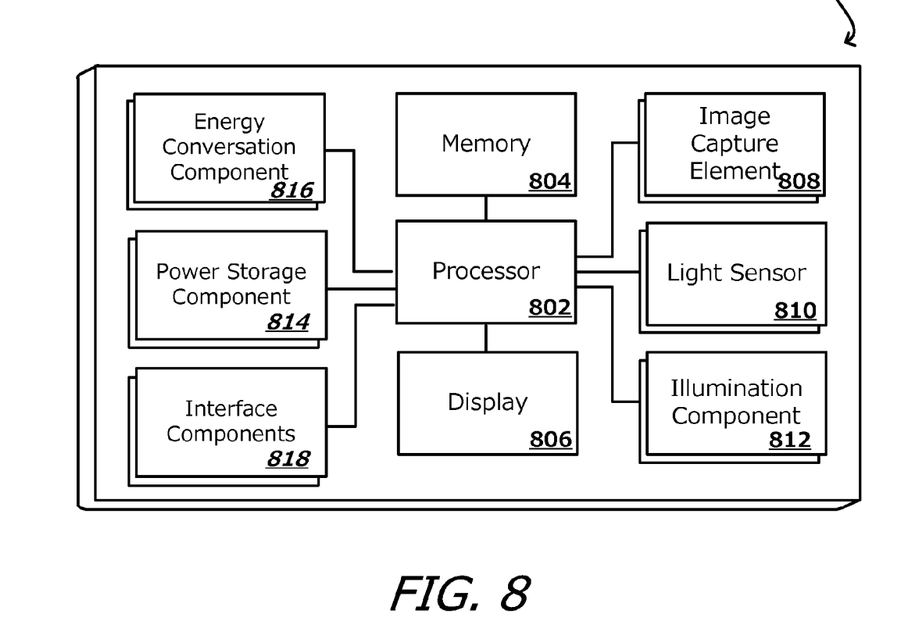
FIG. 8 illustrates example components of a computing device such as that illustrated in FIG. 7.

In order to provide various functionality described herein, FIG. 8 illustrates an example set of basic components of a computing device 800, such as the device 702 described with respect to FIG. 7. In this example, the device includes at least one central processor 802 for executing instructions that can be stored in at least one memory device or element 804. The processor can be used to, for example, process light received at an image sensor (e.g., 110) to generate image data. In accordance with various embodiments, there can be multiple processors, each processor working the same or different tasks. In accordance with an embodiment, at least one processor can be dedicated to image processing, such as image components 112, 212, 312. As would be apparent to one of ordinary skill in the art, the device can include many types of memory, data storage or non-transitory computer-readable storage media, such as a first data storage for program instructions for execution by the processor 802, the same or separate storage can be used for images or data, a removable storage memory can be available for sharing information with other devices, etc. The device typically will include some type of display element 806, such as a touch screen, electronic ink (e-ink), organic light emitting diode (OLED) or liquid crystal display (LCD), although devices such as portable media players might convey information via other means, such as through audio speakers. In at least some embodiments, the display screen provides for touch or swipe-based input using, for example, capacitive or resistive touch technology.

As discussed, the device in many embodiments will include at least two image capture elements 808, such as two or more cameras (or at least one stereoscopic camera) that are able to image a user, people, or objects in the vicinity of the device. An image capture element can include, or be based at least in part upon any appropriate technology, such as a CCD or CMOS image capture element having a determined resolution, focal range, viewable area, and capture rate. The image capture elements can also include at least one IR sensor or detector operable to capture image information for use in determining gestures or motions of the user. The example computing device includes at least one light sensor 810 which determine the need for light when capturing an image, among other such functions. The example device 800 includes at least one illumination component 812, as may include one or more light sources (e.g., white light LEDs, IR emitters, or flash lamps) for providing illumination and/or one or more light sensors or detectors for detecting ambient light or intensity, etc.

The example device can include various interface components 818 to receive input from a user. This input can include, for example, a virtual button, a push button, touch pad, touch screen, wheel, joystick, keyboard, mouse, trackball, keypad or any other such device or element whereby a user can input a command to the device. These I/O devices could even be connected by a wireless infrared or Bluetooth or other link as well in some embodiments. In some embodiments, however, such a device might not include any buttons at all and might be controlled only through a combination of visual (e.g., gesture) and audio (e.g., spoken) commands such that a user can control the device without having to be in contact with the device. In the example of a virtual button, or push button, or other such user-selectable element, selection of the user-selectable element can, for example, operate the shutter (e.g., 210). For example, selection of the user-selectable element can use the shutter to operate in a closed position. As described, a shutter is a device that allows light to pass for a determined period of time, exposing the image sensor and/or other sensors such as photovoltaic cells or other light-sensitive electronic sensor.

The example device can include a power storage component 814 to store energy. Example power storage components (e.g., 114, 214, 314) include, for example, a battery operable to be recharged through conventional plug-in approaches, or through other approaches such as capacitive charging through proximity with a power mat or other such component, or through energy generated via the photovoltaicells. In accordance with various embodiments, the power storage component can correspond to at least one of, for example, a lead-acid battery, a nickel cadmium battery (NiCd), a nickel metal hydride (NiMH) battery, a lithium ion (Li-ion) battery, a lithium ion polymer (Li-ion polymer) battery, or another component configured to store energy. Various other elements and/or combinations are possible as well within the scope of various embodiments.

The example device can include an energy conversion component 816 to convert light into energy. An example energy conversion component can be a photovoltaic cell (e.g., 132, 142, 144, and 324). In accordance with various embodiments, the energy conversion component can include other components that can be used to generate power. For example, a plurality of photovoltaic cells can be connected to form arrays or groupings of photovoltaic cells. The arrays can be coupled to an inverter, which can produce power at a desired voltage, and for AC, a desired frequency.

The device also can include at least one orientation or motion sensor. As discussed, such a sensor can include an accelerometer or gyroscope operable to detect an orientation and/or change in orientation, or an electronic or digital compass, which can indicate a direction in which the device is determined to be facing. The mechanism(s) also (or alternatively) can include or comprise a global positioning system (GPS) or similar positioning element operable to determine relative coordinates for a position of the computing device, as well as information about relatively large movements of the device. The device can include other elements as well, such as may enable location determinations through triangulation or another such approach. These mechanisms can communicate with the processor, whereby the device can perform any of a number of actions described or suggested herein.

What is claimed is:

1. A computing device, comprising:
a camera assembly that includes a camera sensor, the camera sensor having a first region that includes a plurality of camera pixels and a second region that includes a plurality of photovoltaic cells, the second region surrounding a circumference of the first region;
a lens assembly that includes a lens and a plurality of lens elements arranged around a circumference of the lens, a first lens element of the plurality of lens elements configured to direct a first portion of light to a first portion of the second region, the lens configured to direct a second portion of light to the first region wherein the plurality of camera pixels are configured to generate image data from the second portion of light;
a battery configured to store electricity generated by the plurality of photovoltaic cells;
a shutter; and
photovoltaic cells on the shutter, wherein light passing through the lens assembly is received at the photovoltaic cells on the shutter when the shutter is in a closed position and the first portion of light is received at the second region and the second portion of light is received at the first region when the shutter is in an open position.

2. A computing device, comprising:
a lens assembly that includes a lens;
a first sensor that includes an image sensor;
a second sensor that generates energy from light, wherein the lens is configured to direct a first portion of light to the first sensor and a first lens element of the plurality of lens elements is configured to direct a second portion of light to a portion of the second sensor;
a shutter; and
photovoltaic cells on the shutter, wherein light passing through the lens assembly is received at the photovoltaic cells on the shutter when the shutter is in a closed position and the second portion of light is received at the second sensor when the shutter is in an open position.

3. The computing device of claim 2, wherein the shutter is one of a leaf shutter, a focal-plane shutter, or a diaphragm shutter.

4. The computing device of claim 2, wherein the image sensor includes a plurality of pixels and the second sensor includes a plurality of photovoltaic cells, and wherein the plurality of pixels are coplanar with the plurality of photovoltaic cells.

5. The computing device of claim 2, wherein the second sensor includes a plurality of photovoltaic cells, and wherein the plurality of photovoltaic cells are arranged around a circumference of the first sensor.

6. The computing device of claim 2, wherein the image sensor includes a plurality of pixels and the second sensor includes a plurality of photovoltaic cells, and wherein a first photovoltaic cell of the plurality of photovoltaic cells is in a first position intermixed with the plurality of pixels and a second photovoltaic cell of the plurality of photovoltaic cells is in a second position with the plurality of pixels, the first position and the second position being based at least in part on a random arrangement scheme.

7. The computing device of claim 6, wherein the plurality of photovoltaic cells are intermixed with the plurality of pixels in one of a regular pattern or an irregular pattern.

8. The computing device of claim 2, wherein the plurality of lens elements are arranged around a circumference of the lens, and wherein the plurality of lens elements are cylindrical-shaped lenses having a predetermined lens radii arranged with a predetermined pitch.

9. The computing device of claim 2, wherein the lens is positioned in a first layer of the lens assembly and the plurality of lens elements are positioned in a second layer of the lens assembly, the first layer including a first surface of the lens that receives incident light from a light source and the second layer including a second surface of the lens, the plurality of lens elements being coupled along a circumference of the second surface of the lens.

10. The computing device of claim 2, wherein the image sensor includes a plurality of pixels, and wherein the first sensor is one of a complementary metal oxide semiconductor (CMOS) or a charge-coupling device (CCD) sensor, and wherein a portion of the plurality of camera pixels includes photoactive layer.

11. The computing device of claim 10, wherein at least a portion of the plurality of camera pixels can operate in one of a first state as a photosensor or in a second state as a photovoltaic cell.

12. The computing device of claim 2, wherein the second sensor includes a plurality of photovoltaic cells and the computing device further includes:
   a power collection component configured to process energy generated by the plurality of photovoltaic cells.

13. A method, comprising:
   operating a shutter that includes photovoltaic cells on the shutter;
   receiving a first portion of light passing through a lens of a lens assembly by a first sensor that includes an image sensor;
   receiving light passing through the lens at the photovoltaic cells when the shutter is in a closed position; and
   receiving a second portion of light passing through a lens element of a plurality of lens elements by a second sensor when the shutter is an open position, the second sensor configured to generate energy from light,
   wherein the lens is configured to direct a first portion of light to the first sensor and a first lens element of the plurality of lens elements is configured to direct a second portion of light to a portion of the second sensor.

14. The method of claim 13, wherein the image sensor includes a plurality of pixels, and wherein a portion of the plurality of pixels includes a photoactive layer, the method further comprising:
   determining a shutter operating in an open state; and
   operate a the portion of the plurality of pixels that include the photoactive layer as a photosensor.

15. The method of claim 13, wherein the image sensor includes a plurality of pixels and the second sensor includes a plurality of photovoltaic cells, and wherein the plurality of photovoltaic cells are arranged in at least one of around a circumference of the first sensor or intermixed with the plurality of pixels.

* * * * *